(12) United States Patent
Lampenscherf

(10) Patent No.: US 9,166,138 B2
(45) Date of Patent: Oct. 20, 2015

(54) THERMOELECTRIC TRANSDUCER AND HEAT EXCHANGE PIPE

(75) Inventor: Stefan Lampenscherf, Poing (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 162 days.

(21) Appl. No.: 13/878,164

(22) PCT Filed: Sep. 7, 2011

(86) PCT No.: PCT/EP2011/065456
§ 371 (c)(1),
(2), (4) Date: Jun. 14, 2013

(87) PCT Pub. No.: WO2012/045542
PCT Pub. Date: Apr. 12, 2012

(65) Prior Publication Data
US 2013/0255742 A1    Oct. 3, 2013

(30) Foreign Application Priority Data

Oct. 5, 2010   (EP) .................................... 10186505

(51) Int. Cl.
*H01L 35/28* (2006.01)
*H01L 35/30* (2006.01)
*H01L 35/32* (2006.01)

(52) U.S. Cl.
CPC ................ *H01L 35/30* (2013.01); *H01L 35/32* (2013.01)

(58) Field of Classification Search
USPC .......................................... 136/221
See application file for complete search history.

(56) References Cited

U.S. PATENT DOCUMENTS

| 3,054,840 | A  | * | 9/1962 | Alsing | ........................ 136/204 |
| 3,522,106 | A  |   | 7/1970 | Debiesse et al. | |
| 3,607,444 | A  |   | 9/1971 | DeBucs | |
| 2002/0022855 | A1 |   | 2/2002 | Bobroff et al. | |
| 2003/0140957 | A1 | * | 7/2003 | Akiba | ........................ 136/224 |
| 2005/0022855 | A1 |   | 2/2005 | Raver | |
| 2005/0139248 | A1 |   | 6/2005 | Strnad | |

FOREIGN PATENT DOCUMENTS

| EP | 0 644 599 A2 | 3/1995 |
| EP | 1 780 807 A1 | 5/2007 |
| EP | 1 780 811 A1 | 5/2007 |
| EP | 10186505.3 | 10/2010 |
| JP | 7-106641 | 4/1995 |
| JP | 2000-294840 | 10/2000 |
| JP | 2006-294738 | 10/2006 |
| WO | 2012/025476 A1 | 3/2012 |

OTHER PUBLICATIONS

Office Action dated Jul. 3, 2014 in corresponding European Patent Application No. 10186505.3.
International Search Report for PCT/EP2011/065456; mailed Apr. 2, 2012.

\* cited by examiner

*Primary Examiner* — Eli Mekhlin
(74) *Attorney, Agent, or Firm* — Staas & Halsey LLP

(57) ABSTRACT

Thermoelectric elements of a thermoelectric transducer are p-doped and n-doped and are arranged alternately, connected electrically to one another and are formed essentially in the shape of a ring.

2 Claims, 2 Drawing Sheets

THERMOELECTRIC TRANSDUCER AND HEAT EXCHANGE PIPE

This application is the U.S. national stage of International Application No. PCT/EP2011/065456, filed Sep. 7, 2011 and claims the benefit thereof. The International Application claims the benefit of European Application No. 10186505 filed on Oct. 5, 2010, both applications are incorporated by reference herein in their entirety.

BACKGROUND

Described below is a thermoelectric transducer having p-doped and n-doped thermoelectric elements which are arranged alternately and connected electrically to one another, and to a heat exchange pipe having at least one such thermoelectric transducer.

The efficient conversion of thermal energy into electrical energy is a central problem within energy conversion technology. Aside from improving thermal engines used on a large-scale, such as gas and steam turbines, other conversion methods are also increasingly employed in order to develop previously unused thermal sources and/or thermal flows, such as for instance the waste heat of steam-generating power plants. Of particular interest here are methods which can be integrated into the thermal flow of existing installations with a low installation and maintenance outlay. Suited to this in particular are thermoelectric transducers and/or thermoelectric generators of the type cited in the introduction, which are abbreviated below to TEGs. With the aid of such TEGs, heat can be converted directly into electrical current by using the so-called Seebeck effect. Alternatively, a thermoelectric transducer can also effect a change in the heat transport by using the thus named Peltier effect by an external current flow.

A requirement for the efficient use of TEGs is that a good thermal coupling of the TEG to the heat source and/or heat sink and thus the generation of a suitable thermal flow across the TEG heat exchange pipe into steam generators offer a good condition for the use of TEGs, since the thermal flow across the wall of the heat exchange pipe is produced during operation without any additional effort. No practical solution currently exists however for the combination of a TEG and a heat exchange pipe. Previously almost exclusively planar thermoelectric modules were used for the assembly of TEGs, since these are also only commercially available. In order to be able to couple the planar thermoelectric modules in a thermally sufficient manner, the heat exchanger must in most instances be modified with significant effort, which also involves complex assembly and high costs. This is nevertheless not an option for the large-scale use of TEGs in steam-generating power plants.

SUMMARY

Described below is a thermoelectric transducer of the type cited in the introduction, which in particular allows for a cost-effective and maintenance-free combination using heat exchange pipes in order to achieve as efficient a thermoelectric energy conversion and/or control of the thermal flow across the heat exchange pipes as possible. Also described is a corresponding heat exchange pipe having such a thermoelectric transducer.

As described below, a thermoelectric transducer of the type cited in the introduction has thermoelectric elements formed essentially in the shape of a ring. The thermoelectric transducer also has an alternating sequence of p-doped and n-doped thermoelectric elements which are connected electrically to one another.

On account of the ring-shaped embodiment of the thermoelectric elements, this can be easily integrated into heat exchange pipes, in particular into heat exchange pipes embodied with double walls, in other words those which exhibit an outer wall and an inner wall.

"Essentially in the shape of a ring" indicates in this case that the thermoelectric elements can also be embodied in a slotted or segmented manner. Such a slotted or segmented embodiment is consequently advantageous in that a very good mechanical stability can be ensured under production and operational loads. On account of the ring-shaped embodiment of the thermoelectric elements, these can be easily integrated into heat exchange pipes, in particular into heat exchange pipes with double walls, in other words those which exhibit an outer wall and an inner wall.

The thermoelectric elements may be electrically connected to one another by electrically conductive annular conductors, thereby resulting in a particularly simple assembly.

Also described below is a heat exchange pipe, having an outer wall and an inner wall arranged at a distance from the outer wall, with at least one thermoelectric transducer of the type cited previously is arranged between the outer wall and the inner wall.

An electrically insulated layer may be provided between the thermoelectric transducer and the outer wall and/or between the thermoelectric transducer and the inner wall.

According to one embodiment, the thermoelectric elements of the thermoelectric transducer are mechanically prestressed between the outer wall and the inner wall in order in this way to ensure a good thermal contact.

If such a heat exchange pipe is employed for instance to use the waste heat from a steam turbine, a radial thermal flow thus develops across the ring-shaped thermoelectric elements during operation, which is driven by the exhaust gas flow on the hot side and the cooling circuit on the cold side. The thermal flow can be partially converted into electrical energy depending on the quality of the TEGs, if the thermoelectric transducer is employed as a generator, or can be influenced and/or regulated by a selective electrical activation of the TEGs thereby resulting in control of the thermal transfer. During operation as a generator, direct current is produced in the TEGs. In order to avoid conversion losses, this can be routed via a DC/DC converter directly onto a shared direct current intermediate circuit with other consumers, and for instance can be used to power control and regulation systems in the power plant.

The use of ring-shaped thermoelectric elements results in a stable, structure-conform and cost-effective variant in the combination of heat exchange pipes and TEGs.

BRIEF DESCRIPTION OF THE DRAWINGS

Further features and advantages are apparent with the aid of the subsequent description of an embodiment of a thermoelectric transducer and an embodiment of a heat exchange pipe with reference to the accompanying drawings of which.

DETAILED DESCRIPTION OF THE PREFERRED EMBODIMENT

Figure 1:
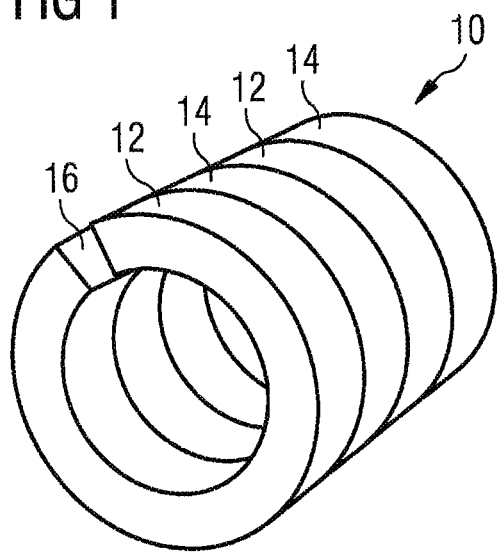
FIG. 1 is a schematic perspective view of a thermoelectric transducer according to an embodiment.

Reference will now be made in detail to the preferred embodiments, examples of which are illustrated in the accompanying drawings, wherein like reference numerals refer to like elements throughout.

FIG. 1 shows a schematic view of a thermoelectric transducer and/or thermoelectric generator 10 according to an embodiment, which is referred to below as TEG. The TEG 10 includes a plurality of p-doped and n-doped thermoelectric elements 12 and 14 respectively which are arranged alternately and connected electrically to one another, of which in FIG. 1 only two are shown in each instance for the sake of simplicity. The thermoelectric elements 12 and 14 are embodied in each instance in the shape of a ring and are provided with a recess 16 which interrupts the ring structure, as a result of which a slotted arrangement is produced. Alternatively, the thermoelectric elements 12 and 14 can also be embodied in a segmented manner. The slotted or segmented embodiment of the thermoelectric elements 12 and 14 is primarily used to produce a mechanical pre-stressing in the radial direction, as is explained again in more detail below.

Figure 2:
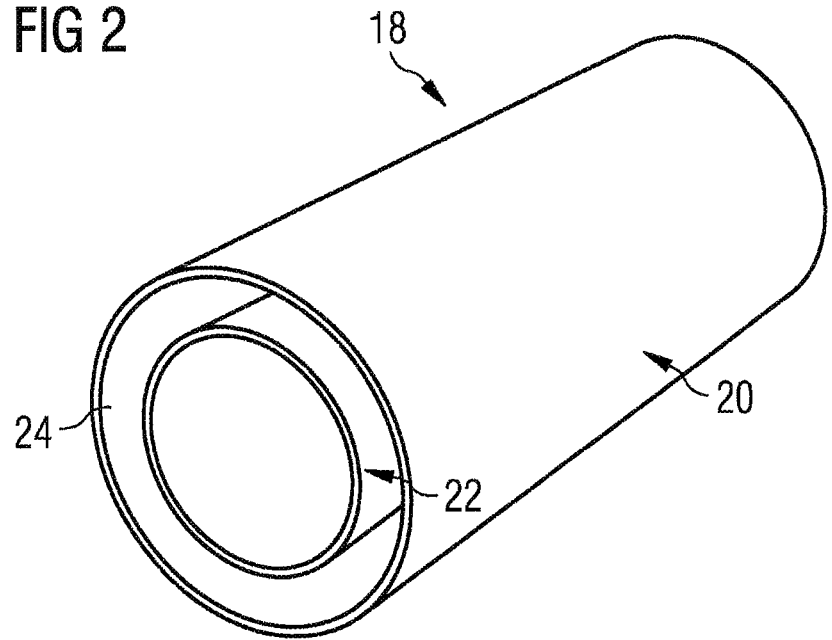
FIG. 2 is a schematic perspective view of a double-walled heat exchange pipe.

FIG. 2 shows a heat exchange pipe 18 having a tubular outer wall 20 and a tubular inner wall 22. The inner wall 22 is arranged coaxially with respect to the outer wall and at a distance therefrom, so that a ring-shaped clearance 24 extends between the two walls 20 and 22.

Figure 3:
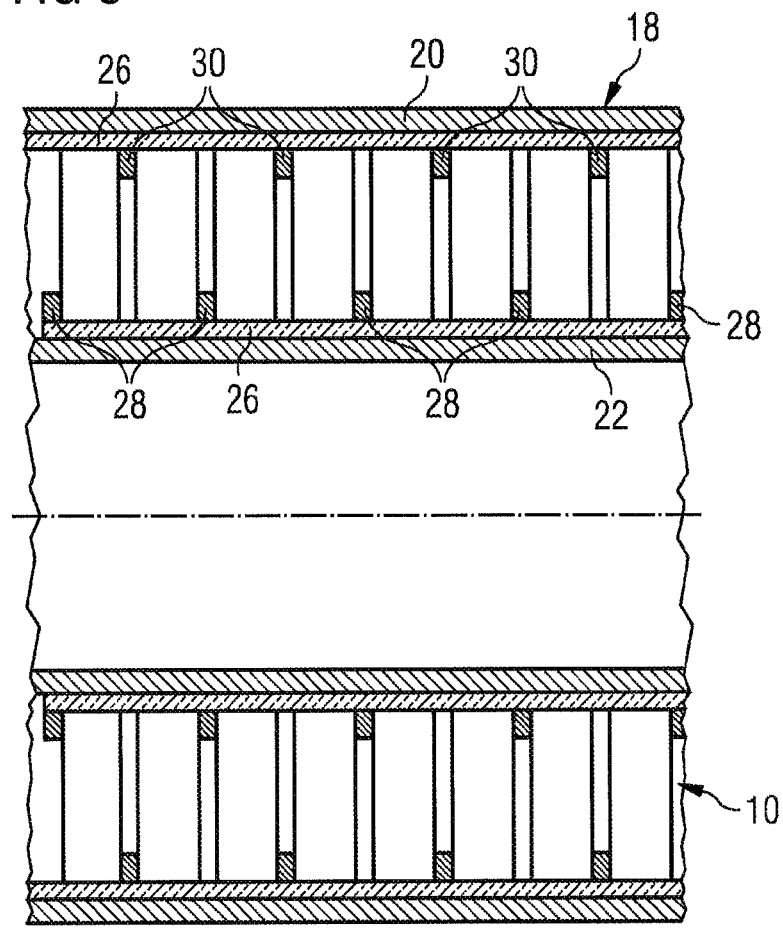
FIG. 3 is a schematic sectional view of the heat exchange pipe shown in FIG. 2, in which the thermoelectric transducer shown in FIG. 1 is accommodated.

FIG. 3 shows a cross-sectional view of the heat exchange pipe 18 shown in FIG. 2, into the clearance 24 of which the TEG 10 shown in FIG. 1 is inserted. An electrically insulating layer 26 is provided in each instance between the outer periphery of the TEG 10 and the inner periphery of the outer wall 20 and between the outer periphery of the inner wall 22 and the inner periphery of the TEG 10, in order to produce an electrical separation between the TEG 10 and the heat exchange pipe 18. As is clearly apparent from FIG. 3, the thermoelectric elements 12 and 14 are in each instance electrically connected to one another by an electrically conductive annular conductor 28 or 30, wherein the annular conductors 28 and 30 extend alternately along the inner periphery and along the outer periphery of the thermoelectric elements 12 and 14. A robust assembly is achieved in this way. The thermoelectric elements 12 and 14 are inserted into the clearance 24 defined between the outer wall 20 and the inner wall 22 under a mechanical pre-stressing. This mechanical pre-stressing is achieved by the opposing free ends of each thermoelectric element 12 and 14 generated by the slot-shaped recess 16 being moved toward one another prior to insertion into the clearance 24, so that these spread in the inserted state and rest correspondingly on the outer wall 20 and/or inner wall 22 of the heat exchange pipe 18.

Figure 4:
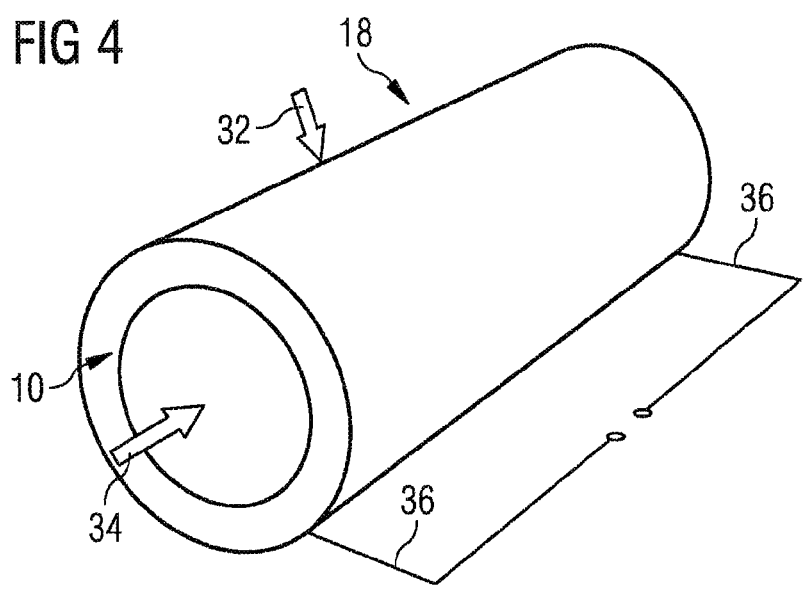
FIG. 4 is a schematic perspective view of the heat exchange pipe shown in FIG. 3.

FIG. 4 shows a schematic representation of the functional principle of the heat exchange pipe 18 shown in FIG. 3, if this is employed for instance to use the waste heat of a steam turbine. During operation, a radial thermal flow is produced across the ring-shaped thermoelectric elements 12, 14, which is driven by the waste gas flow indicated with arrow 32 on the hot side and the cooling circuit indicated by arrow 34 on the cold side.

If the TEG 10 is employed as a generator, the thermal flow can be partially converted into electric energy, which can be tapped off in the form of direct current by way of corresponding conductors 36. In order to prevent conversion losses across a DC/DC converter, this can be routed for instance directly onto a shared direct current intermediate circuit with other consumers and then used for instance to supply control and regulation in power plant. Alternatively, the thermal flow can be influenced and/or regulated by a selective electrical activation of the TEG 10 via the conductor 36 thereby resulting in control of the thermal transfer.

The use of ring-shaped thermoelectric elements 12 and 14 results in a stable, structure-conform and cost-effective variant when combining the TEG 10 with the heat exchange pipe 18.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV,* 358 F3d 870, 69 USPQ2d 1865 (Fed. Cir. 2004).

The invention claimed is:

1. A heat exchange pipe, comprising:
   an outer wall;
   an inner wall arranged at a distance from the outer wall; and
   at least one thermoelectric transducer arranged between the outer wall and the inner wall and formed of p-doped and n-doped thermoelectric elements arranged alternately, connected electrically to one another, each formed in a one-piece, slotted structure of a ring interrupted by a slot-shaped recess, and pre-stressed so as to be exerting a radially outward force on an inner surface of the outer wall.

2. The heat exchange pipe as claimed in claim 1, further comprising an electrically insulating layer between the at least one thermoelectric transducer and at least one of the outer wall and the inner wall.

* * * * *